United States Patent
Shen et al.

(10) Patent No.: US 9,154,261 B2
(45) Date of Patent: Oct. 6, 2015

(54) LOW DENSITY PARITY CHECK (LDPC) CODING IN COMMUNICATION SYSTEMS

(71) Applicant: BROADCOM CORPORATION, Irvine, CA (US)

(72) Inventors: Ba-Zhong Shen, Irvine, CA (US); Tak K. Lee, Irvine, CA (US); Jonathan S. Min, Newport Coast, CA (US); Avi Kliger, Ramat Gan (IL); Richard S. Prodan, Niwot, CO (US)

(73) Assignee: Broadcom Corporation, Irvine, CA (US)

( * ) Notice: Subject to any disclaimer, the term of this patent is extended or adjusted under 35 U.S.C. 154(b) by 77 days.

(21) Appl. No.: 14/068,479

(22) Filed: Oct. 31, 2013

(65) Prior Publication Data

US 2014/0201588 A1     Jul. 17, 2014

Related U.S. Application Data

(60) Provisional application No. 61/753,241, filed on Jan. 16, 2013, provisional application No. 61/759,171, filed on Jan. 31, 2013, provisional application No. 61/760,612, filed on Feb. 4, 2013, provisional application No. 61/775,913, filed on Mar. 11, 2013, provisional application No. 61/777,561, filed on Mar. 12, 2013, provisional application No. 61/812,776, filed on Apr. 17, 2013, provisional application No. 61/886,125, filed on Oct. 3, 2013.

(51) Int. Cl.
*H04L 1/00* (2006.01)
*H03M 13/11* (2006.01)

(52) U.S. Cl.
CPC ............ *H04L 1/0041* (2013.01); *H03M 13/116* (2013.01); *H03M 13/1185* (2013.01); *H03M 13/1188* (2013.01)

(58) Field of Classification Search
CPC .......... H03M 13/1185; H03M 13/116; H03M 13/1188; H03M 13/1137; H03M 13/1174; H03M 13/118; H03M 13/616; H03M 13/6362; H04L 1/0041
USPC .................................. 714/752, 758, 801, 790
See application file for complete search history.

(56) References Cited

U.S. PATENT DOCUMENTS

| 7,395,494 | B2 * | 7/2008 | Lee et al. ...................... 714/801 |
| 7,617,439 | B2 * | 11/2009 | Shen et al. .................... 714/784 |
| 7,752,521 | B2 * | 7/2010 | Livshitz ........................ 714/752 |
| 7,802,172 | B2 * | 9/2010 | Vila Casado et al. ......... 714/801 |

(Continued)

*Primary Examiner* — James C Kerveros

(74) *Attorney, Agent, or Firm* — Garlick & Markison; Shayne X. Short

(57) ABSTRACT

A communication device is configured to encode and/or decode low density parity check (LDPC) coded signals. Such LDPC coded signals are characterized by LDPC matrices having a particular form. An LDPC matrix may be partitioned into a left hand side matrix and the right hand side matrix. The right hand side matrix can be lower triangular such that all of the sub-matrices therein are all-zero-valued sub-matrices (e.g., all of the elements within an all-zero-valued sub-matrix have the value of "0") except for those sub-matrices located on a main diagonal of the right hand side matrix and another diagonal that is adjacently located to the left of the main diagonal. A device may be configured to employ different LDPC codes having different LDPC matrices for different LDPC coded signals. The different LDPC matrices may be based generally on a common form (e.g., with a right hand side matrix as described above).

20 Claims, 9 Drawing Sheets

(56) References Cited

U.S. PATENT DOCUMENTS

| | | | |
|---|---|---|---|
| 7,882,418 B2 * | 2/2011 | Lee et al. | 714/758 |
| 7,917,829 B2 * | 3/2011 | Livshitz | 714/752 |
| 8,140,930 B1 * | 3/2012 | Maru | 714/752 |
| 8,196,012 B2 * | 6/2012 | Lau et al. | 714/758 |
| 8,261,155 B2 * | 9/2012 | Richardson et al. | 714/758 |
| 8,271,846 B2 * | 9/2012 | Myung et al. | 714/752 |
| 8,286,065 B2 * | 10/2012 | Myung et al. | 714/790 |
| 8,433,984 B2 * | 4/2013 | Khandekar et al. | 714/779 |
| 8,464,123 B2 * | 6/2013 | Alrod et al. | 714/752 |
| 8,631,299 B2 * | 1/2014 | Sugihara et al. | 714/751 |

* cited by examiner

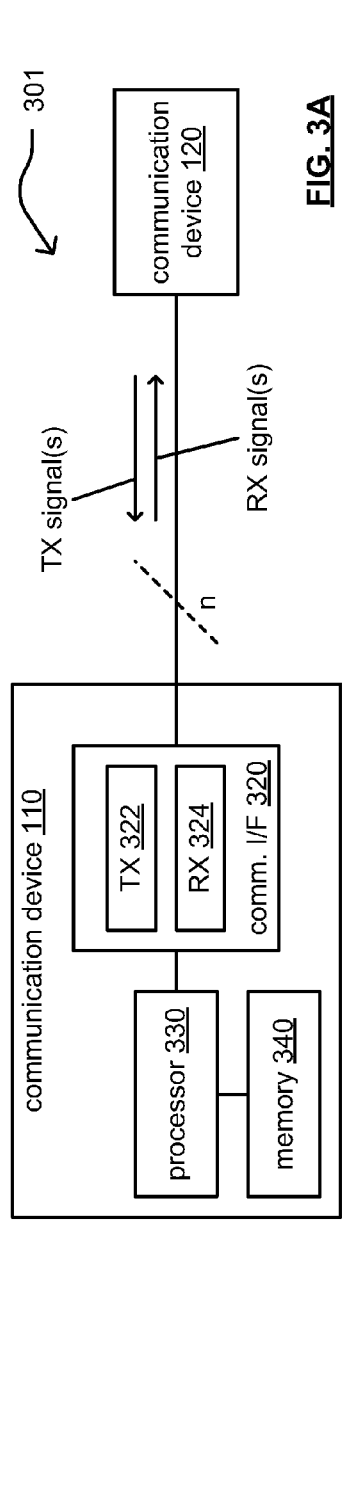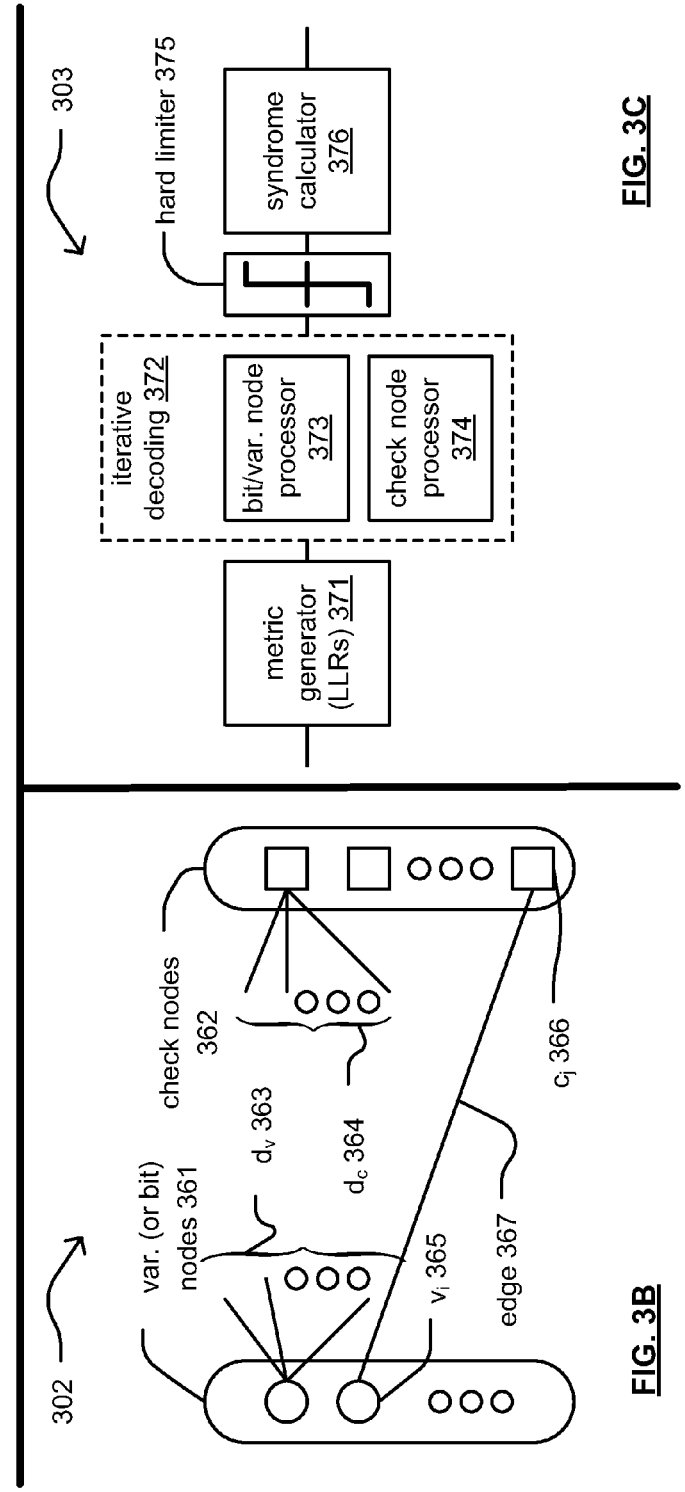

FIG. 5A

$$H = \begin{bmatrix} H_{LHS} & H_{RHS} \end{bmatrix}$$

$$H_{LHS} = \begin{bmatrix} S_{0,0} & S_{0,0} & \cdots & S_{0,x-1} \\ S_{1,0} & S_{1,0} & & S_{1,x-1} \\ \vdots & & \ddots & \vdots \\ S_{M-1,0} & S_{M-1,0} & \cdots & S_{M-1,x-1} \end{bmatrix}$$

$$H_{RHS} = \begin{bmatrix} S_{0,x} & & & S_{0,N-1} \\ S_{1,x} & & & S_{1,N-1} \\ \vdots & \ddots & & \vdots \\ S_{M-1,x} & & \cdots & S_{M-1,N-1} \end{bmatrix}$$

FIG. 5B

$$\begin{bmatrix} -1 & -1 & CSI \\ -1 & CSI & CSI \\ CSI & CSI & -1 \end{bmatrix}$$

$$\begin{bmatrix} -1 & -1 & -1 & CSI \\ -1 & -1 & CSI & CSI \\ -1 & CSI & CSI & -1 \\ CSI & CSI & -1 & -1 \end{bmatrix}$$

$$\begin{bmatrix} -1 & -1 & -1 & -1 & CSI \\ -1 & -1 & -1 & CSI & CSI \\ -1 & -1 & CSI & CSI & -1 \\ -1 & CSI & CSI & -1 & -1 \\ CSI & CSI & -1 & -1 & -1 \end{bmatrix}$$

$$H = \begin{bmatrix} H_{LHS,1} & H_{LHS,2} & H_{RHS} \end{bmatrix}$$

$H_{LHS,1} =$

| 93 | 271 | -1 | 83 | 26 | 208 | 245 | 200 | -1 | 175 | 331 | 17 | 86 | -1 | 337 | -1 | 238 | 81 | -1 | 307 |
|---|---|---|---|---|---|---|---|---|---|---|---|---|---|---|---|---|---|---|---|
| 274 | 115 | 329 | 338 | 124 | -1 | 293 | -1 | 69 | 64 | 342 | -1 | 88 | 139 | -1 | 191 | 323 | 22 | 298 | 108 |
| 134 | 355 | 175 | 24 | 253 | 242 | -1 | 187 | 94 | 26 | 87 | 302 | -1 | -1 | 137 | 212 | -1 | 245 | 294 | 240 |
| -1 | -1 | 184 | 70 | 247 | 14 | 22 | 7 | 285 | 54 | -1 | 352 | 26 | 108 | 10 | 22 | -1 | 157 | 195 | — |
| 253 | 273 | 90 | -1 | -1 | 151 | 311 | 320 | 339 | -1 | 295 | 148 | 48 | 91 | 62 | 100 | 232 | 146 | 200 | 135 |

$H_{LHS,2} =$

| -1 | 165 | -1 | 47 | 76 | 73 | 150 | 349 | 139 | 331 | 118 | 345 | 27 | 294 | -1 | 145 | 279 | 97 | 106 | 160 |
|---|---|---|---|---|---|---|---|---|---|---|---|---|---|---|---|---|---|---|---|
| 357 | 81 | 194 | 1 | 159 | 56 | 72 | 126 | 277 | 156 | 32 | 111 | 175 | -1 | 306 | 224 | -1 | 206 | -1 | 29 |
| 84 | 76 | 342 | 345 | 174 | 269 | 329 | -1 | 214 | -1 | -1 | -1 | -1 | 218 | 104 | 40 | 197 | 73 | 229 | 63 |
| 336 | 49 | 202 | 359 | 342 | -1 | -1 | 106 | -1 | 273 | 177 | 245 | 98 | 355 | 178 | 176 | 147 | -1 | 280 | -1 |
| 12 | -1 | 179 | -1 | 232 | -1 | 21 | 331 | 313 | 349 | 34 | 97 | 187 | 38 | -1 | 235 | 52 | 170 | 58 | 58 |

$H_{RHS} =$

| 143 | -1 | -1 | -1 | -1 |
|---|---|---|---|---|
| 106 | 334 | -1 | -1 | -1 |
| -1 | 270 | 72 | -1 | -1 |
| -1 | -1 | 221 | 208 | -1 |
| -1 | -1 | -1 | 257 | 0 |

FIG. 6

$$H = \begin{bmatrix} H_{LHS,1} & H_{LHS,2} & H_{RHS} \end{bmatrix}$$

$H_{LHS,1} =$

| 142 | 158 | 113 | 124 | 92 | 44 | 93 | 70 | 172 | 3 | 25 | 44 | 141 | 160 |
|---|---|---|---|---|---|---|---|---|---|---|---|---|---|
| 54 | 172 | 145 | 28 | 55 | 19 | 159 | 22 | 96 | 12 | 85 | -1 | 128 | 5 |
| 63 | 11 | 112 | 114 | 61 | 123 | 72 | 55 | 114 | 20 | 53 | 114 | 42 | 33 |
| 28 | 160 | 102 | 44 | 8 | 84 | 126 | 9 | 169 | 174 | 147 | 24 | 145 | -1 |
| 52 | 159 | 75 | 74 | 46 | 71 | 42 | 11 | 108 | 153 | -1 | 72 | -1 | 163 |

$H_{LHS,2} =$

| 50 | 45 | 118 | 84 | 64 | 66 | 97 | 1 | 115 | 8 | 108 | -1 | -1 |
|---|---|---|---|---|---|---|---|---|---|---|---|---|
| 158 | 120 | 51 | 171 | 65 | 141 | -1 | 42 | 83 | 7 | -1 | 39 | 121 | 84 |
| 4 | 66 | 163 | 50 | 46 | 17 | 175 | -1 | -1 | 92 | -1 | 39 | 121 | 84 |
| 26 | -1 | -1 | 2 | 67 | 82 | 4 | 177 | 151 | 131 | 139 | -1 | 117 | 36 | 18 |
| -1 | 9 | 2 | 168 | 158 | -1 | 1 | 49 | 89 | 63 | 179 | 10 | 75 | 161 |

$H_{RHS} =$

| 22 | -1 | -1 | -1 | -1 |
|---|---|---|---|---|
| 101 | 171 | -1 | -1 | 19 |
| -1 | 34 | 74 | -1 | 177 |
| -1 | -1 | 23 | 8 | -1 |
| -1 | -1 | -1 | -1 | 19 |

FIG. 7

$$H = \begin{bmatrix} H_{LHS} & H_{RHS} \end{bmatrix}$$

$H =$

| 5 | 14 | 12 | 1 | 2 | 37 | 45 | 26 | 24 | 0 | 3 | -1 | 34 | 7 | 46 | 10 | -1 | -1 | -1 | -1 |
|---|----|----|---|---|----|----|----|----|---|---|----|----|---|----|----|----|----|----|----|
| 0 | 35 | 1 | 26 | 0 | 10 | 16 | 16 | 34 | 4 | 2 | 23 | 0 | 51 | -1 | 49 | 20 | -1 | -1 | -1 |
| 12 | 28 | 22 | 46 | 3 | 16 | 51 | 2 | 25 | 29 | 19 | 18 | 52 | -1 | 37 | -1 | 34 | 39 | -1 | -1 |
| 0 | 51 | 16 | 31 | 13 | 39 | 27 | 33 | 8 | 27 | 53 | 13 | -1 | 52 | 33 | -1 | -1 | -1 | 7 | -1 |
| 36 | 6 | 3 | 51 | 4 | 19 | 4 | 45 | 48 | 9 | -1 | 11 | 22 | 23 | 43 | -1 | -1 | -1 | 14 | 1 |

$H_{LHS} =$

| 5 | 14 | 12 | 1 | 2 | 37 | 45 | 26 | 24 | 0 | 3 | -1 | 34 | 7 | 46 |
|---|----|----|---|---|----|----|----|----|---|---|----|----|---|----|
| 0 | 35 | 1 | 26 | 0 | 10 | 16 | 16 | 34 | 4 | 2 | 23 | 0 | 51 | -1 |
| 12 | 28 | 22 | 46 | 3 | 16 | 51 | 2 | 25 | 29 | 19 | 18 | 52 | -1 | 37 |
| 0 | 51 | 16 | 31 | 13 | 39 | 27 | 33 | 8 | 27 | 53 | 13 | -1 | 52 | 33 |
| 36 | 6 | 3 | 51 | 4 | 19 | 4 | 45 | 48 | 9 | -1 | 11 | 22 | 23 | 43 |

$H_{RHS} =$

| 10 | -1 | -1 | -1 | -1 |
|----|----|----|----|----|
| 49 | 20 | -1 | -1 | -1 |
| -1 | 34 | 39 | -1 | -1 |
| -1 | -1 | -1 | 7 | -1 |
| -1 | -1 | -1 | 14 | 1 |

FIG. 8

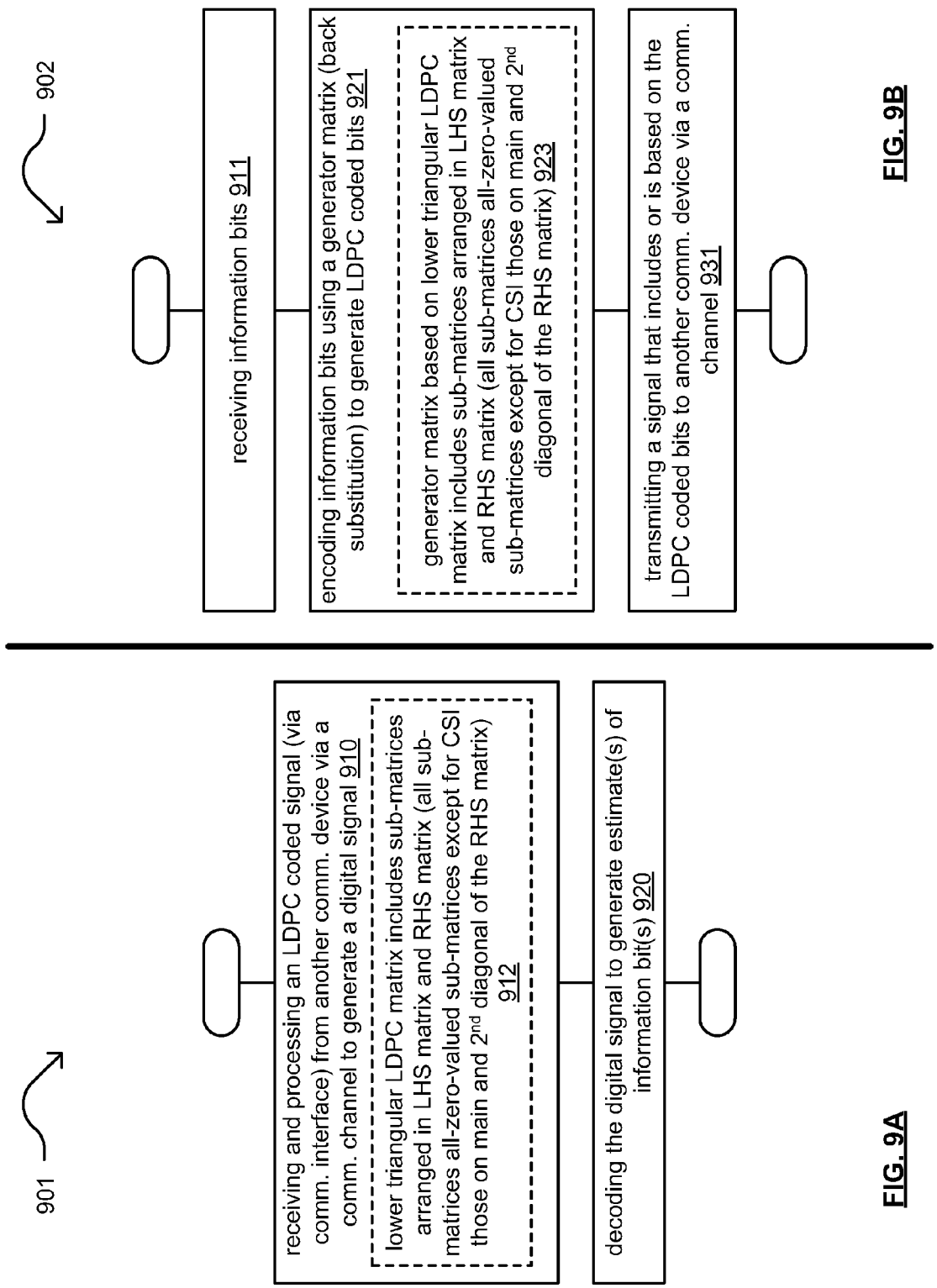

LOW DENSITY PARITY CHECK (LDPC) CODING IN COMMUNICATION SYSTEMS

CROSS REFERENCE TO RELATED PATENTS/PATENT APPLICATIONS

Provisional Priority Claims

The present U.S. Utility patent application claims priority pursuant to 35 U.S.C. §119(e) to the following U.S. Provisional patent applications which are hereby incorporated herein by reference in their entirety and made part of the present U.S. Utility patent application for all purposes:

1. U.S. Provisional Patent Application Ser. No. 61/753,241, entitled "Low density parity check (LDPC) codes for use in communication systems including cable based systems," filed Jan. 16, 2013, pending.

2. U.S. Provisional Patent Application Ser. No. 61/759,171, entitled "Low density parity check (LDPC) codes for use in communication systems including cable based systems," filed Jan. 31, 2013, pending.

3. U.S. Provisional Patent Application Ser. No. 61/760,612, entitled "Low density parity check (LDPC) codes for use in communication systems including cable based systems," filed Feb. 4, 2013, pending.

4. U.S. Provisional Patent Application Ser. No. 61/775,913, entitled "Low density parity check (LDPC) codes for use in communication systems including cable based systems," filed Mar. 11, 2013, pending.

5. U.S. Provisional Patent Application Ser. No. 61/777,561, entitled "Low density parity check (LDPC) codes for use in communication systems including cable based systems," filed Mar. 12, 2013, pending.

6. U.S. Provisional Patent Application Ser. No. 61/812,776, entitled "Low density parity check (LDPC) codes for use in communication systems including cable based systems," filed Apr. 17, 2013, pending.

7. U.S. Provisional Patent Application Ser. No. 61/886,125, entitled "Low density parity check (LDPC) coding in communication systems," filed Oct. 3, 2013, pending.

BACKGROUND

1. Technical Field

The present disclosure relates generally to communication systems; and, more particularly, to forward error correction (FEC) and/or error correction code (ECC) coding within such communication systems.

2. Description of Related Art

Data communication systems have been under continual development for many years. The primary goal within such communication systems is to transmit information successfully between devices. Unfortunately, many things can deleteriously affect signals transmitted within such systems resulting in degradation of or even complete failure of communication. Examples of such adverse effects include interference and noise that may be caused by a variety of sources including other communications, low-quality communication links, degraded or corrupted interfaces and connectors, etc.

Some communication systems use forward error correction (FEC) coding or error correction code (ECC) coding to increase the amount of information that may be transmitted between devices. When a signaling incurs one or more errors during transmission, a receiver device can employ the FEC or ECC coding to try to correct those one or more errors.

A continual and primary directive in this area of development has been to try continually to lower the SNR required to achieve a given bit error rate (BER) or symbol error rate (SER) within a communication system. The ideal goal has been to try to reach Shannon's limit in a communication channel. Shannon's limit may be viewed as being the data rate to be used in a communication channel, having a particular signal to noise ratio (SNR), which achieves error free transmission through the communication channel. The Shannon limit is the theoretical bound for channel capacity for a given modulation and code rate.

Within the context of communication systems that employ one or more types of FEC or ECC coding, there continues to be much room for improvement related to better designed codes that provide for better performance (e.g., lower BER or SER for a given signal to noise ratio (SNR)). Also, a given application may operate more effectively with FEC or ECC coding particularly tailored for that application. One FEC or ECC code may be more effective or efficient in one application as compared to another.

BRIEF DESCRIPTION OF THE SEVERAL VIEWS OF THE DRAWINGS

FIG. 3A is a diagram illustrating a communication device operative within one or more communication systems.

FIG. 3B illustrates an example of an LDPC (Low Density Parity Check) code bipartite graph.

FIG. 3C illustrates an example of decoding of an LDPC coded signal.

FIG. 5A is a diagram illustrating an example of an LDPC matrix partitioned into a left hand side matrix and a right hand side matrix.

FIG. 5B is a diagram illustrating some examples of right hand side matrices of LDPC matrices.

FIG. 6 is a diagram illustrating an example of a long size LDPC code.

FIG. 7 is a diagram illustrating an example of a medium size LDPC code.

FIG. 8 is a diagram illustrating an example of a short size LDPC code.

FIG. 9A is a diagram illustrating an embodiment of a method for execution by one or more communication devices.

FIG. 9B is a diagram illustrating another embodiment of a method for execution by one or more communication devices.

DETAILED DESCRIPTION

Figure 1:
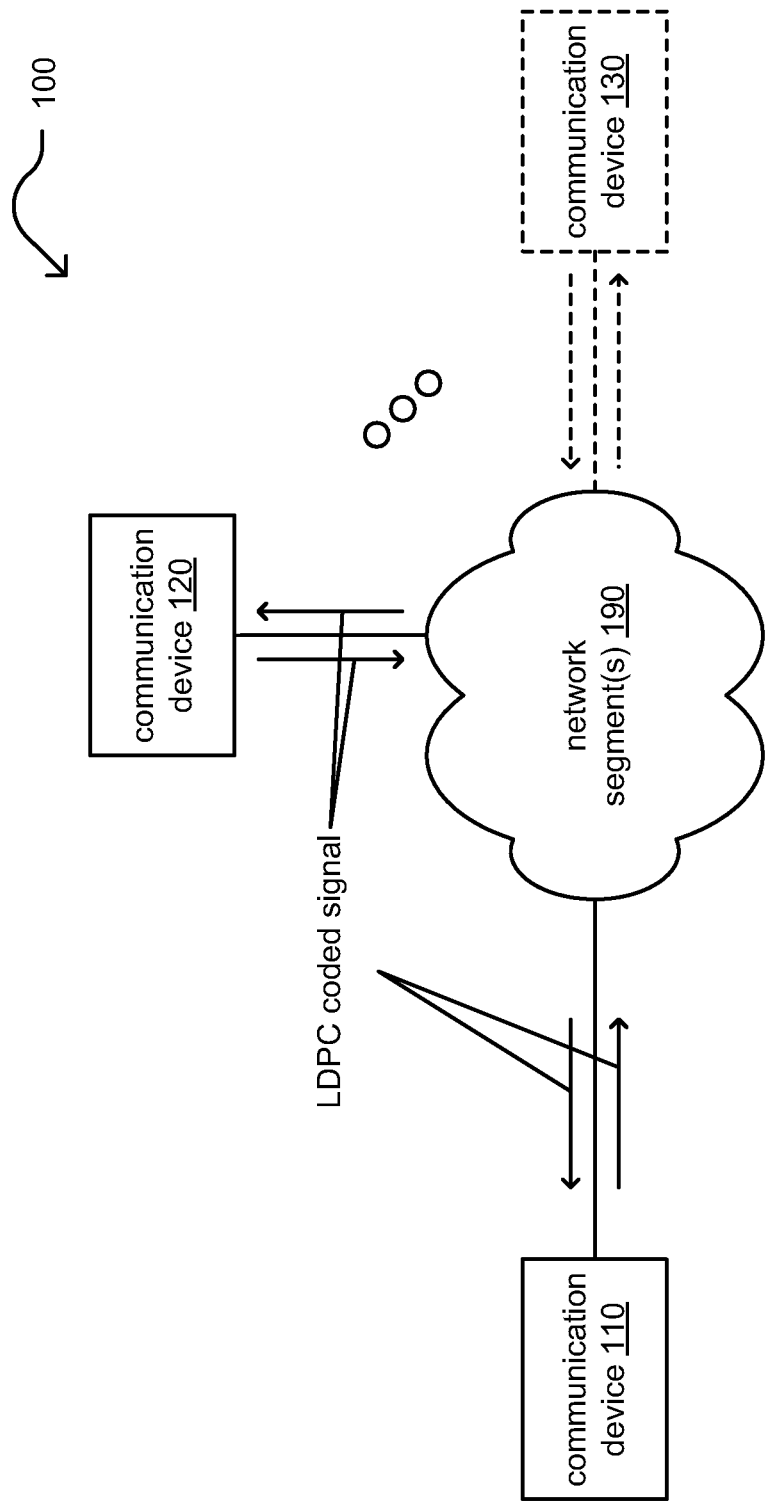
FIG. 1 is a diagram illustrating an embodiment of one or more communication systems.

FIG. 1 is a diagram illustrating an embodiment 100 of one or more communication systems. One or more network segments 190 provide communication inter-connectivity for at least two communication devices 110 and 120. Generally speaking, any desired number of communication devices is included within one or more communication systems (e.g., as shown by communication device 130). Some or all the various communication devices 110-130 include capability to operate using forward error correction (FEC) and/or error correction code (ECC) as described herein.

The various communication links within the one or more network segments 190 may be implemented using any of a variety of communication media including communication links implemented as wireless, wired, optical, satellite, microwave, etc. communication links. Also, in some instances, communication links of different types may cooperatively form a connection pathway between any two communication devices. Considering one example, a communication pathway between devices 110 and 120 may include some segments of wired communication links and other segments of optical communication links. Note also that the devices 110-130 may be of a variety of types of devices including stationary devices, mobile devices, portable devices, etc. and may support communications for any of a number of services or service flows including data, telephony, television, Internet, media, synchronization, etc.

In an example of operation, device 110 includes a communication interface to support communications with one or more of the other devices 120-130. This communication may be bidirectional/to and from the one or more of the other devices 120-130 or unidirectional (or primarily unidirectional) to or from the one or more of the other devices 120-130.

The device 110 may be configured to receive a low density parity check (LDPC) coded signal from one of the other devices 120-130. The device 110 can include a communication interface to perform appropriate demodulation of the received signal (e.g., digital sampling, frequency conversion such as down-conversion, gain adjustment or scaling, etc.) to generate another signal (e.g., a digital signal, such as a baseband signal) that may undergo decoding within a processor of the device 110 to generate one or more estimates of one or more bits encoded within the LDPC coded signal.

Also, the device 110 may be configured to generate an LDPC coded signal for transmission to one or more of the other devices 120-130. A processor of the device 110 can perform LDPC and coding of one or more information bit to generate LDPC coded bits and/or one or more LDPC codewords. The communication interface of the device 110 can then generate a continuous time signal based on the LDPC coded bits and/or one or more LDPC codewords and transmit that continuous time signal to one or more of the other devices 120-130.

The LDPC coded signal may be based on an LDPC matrix having a predetermined or known form. For example, the LDPC matrix may be constructed to include a number of sub-matrices. In addition, the LDPC matrix may be arranged in a left hand side matrix and a right hand side matrix. The right hand side matrix can be lower triangular such that all of the sub-matrices therein are all-zero-valued sub-matrices (e.g., all of the elements within an all-zero-valued sub-matrix have the value of "0") except for those sub-matrices located on a main diagonal of the right hand side matrix and another diagonal that is adjacently located to the left of the main diagonal. Those sub-matrices located on the main diagonal and this other diagonal may be CSI (Cyclic Shifted Identity) sub-matrices. The respective sub-matrices located on these two diagonals may be based on different cyclic shift values. Some examples of such a right hand side matrix are described below with reference to FIG. 5B.

Note also that different LDPC codes having different LDPC matrices may be employed to generate different LDPC coded signals. The device 110 may operate using a first LDPC code with a first LDPC matrix at one time, and a second LDPC code with a second LDPC matrix at another time, etc. Generally, the device 110 may perform encoding and/or decoding using different LDPC codes at different times.

Figure 2:
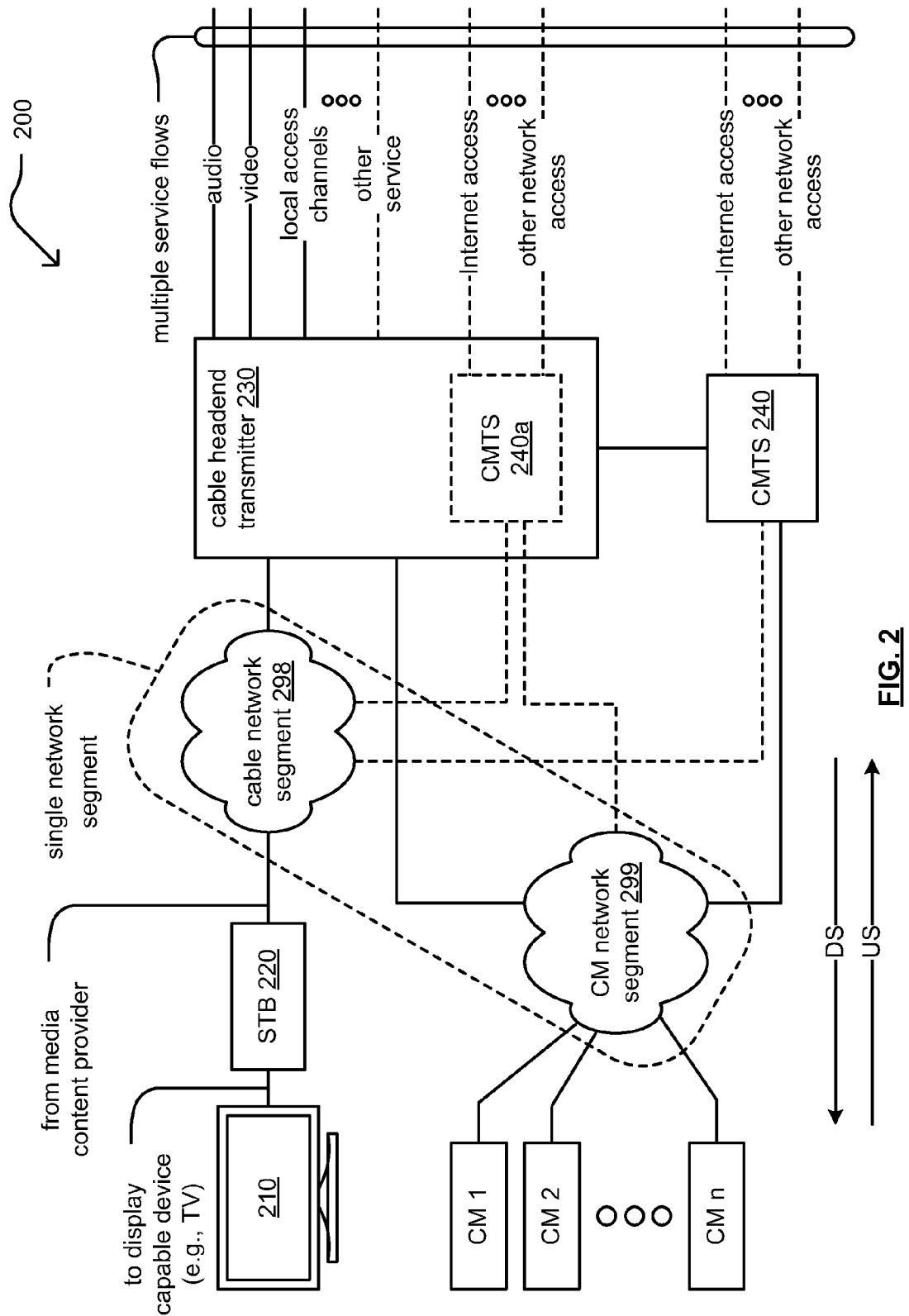
FIG. 2 is a diagram illustrating another embodiment of one or more communication systems.

FIG. 2 is a diagram illustrating another embodiment 200 of one or more communication systems. A cable headend transmitter 230 provides service to a set-top box (STB) 220 via cable network segment 298. The STB 220 provides output to a display capable device 210. The cable headend transmitter 230 can support any of a number of service flows such as audio, video, local access channels, as well as any other service of cable systems. For example, the cable headend transmitter 230 can provide media (e.g., video and/or audio) to the display capable device.

The cable headend transmitter 230 may provide operation of a cable modem termination system (CMTS) 240*a*. For example, the cable headend transmitter 230 may perform such CMTS functionality, or a CMTS may be implemented separately from the cable headend transmitter 230 (e.g., as shown by reference numeral 240). The CMTS 240 can provide network service (e.g., Internet, other network access, etc.) to any number of cable modems (shown as CM 1, CM 2, and up to CM n) via a cable modem (CM) network segment 299. The cable network segment 298 and the CM network segment 299 may be part of a common network or common networks. The cable modem network segment 299 couples the cable modems 1-n to the CMTS (shown as 240 or 240*a*). Such a cable system (e.g., cable network segment 298 and/or CM network segment 299) may generally be referred to as a cable plant and may be implemented, at least in part, as a hybrid fiber-coaxial (HFC) network (e.g., including various wired and/or optical fiber communication segments, light sources, light or photo detection complements, etc.).

A CMTS 240 (or 240*a*) is a component that exchanges digital signals with cable modems 1-n on the cable modem network segment 299. Each of the cable modems is coupled to the cable modem network segment 299, and a number of elements may be included within the cable modem network segment 299. For example, routers, splitters, couplers, relays, and amplifiers may be contained within the cable modem network segment 299. Generally speaking, downstream information may be viewed as that which flows from the CMTS 240 to the connected cable modems (e.g., CM 1, CM2, etc.), and upstream information as that which flows from the cable modems to the CMTS 240.

At least some of the devices within this diagram are implemented to perform encoding and/or decoding of LDPC coded signals. For example, the CMTS 240 (or 240*a*) and/or any one or more of the cable modems 1-n may generate/encode and transmit or receive and process/decode LDPC coded signals to other devices within the system.

An LDPC code employed by one or more of the devices within the system may be based on an LDPC matrix that is constructed using a number of sub-matrices and that is arranged in a left hand side matrix and the right hand side matrix. The right hand side matrix can be lower triangular such that all of the sub-matrices therein are all-zero-valued sub-matrices (e.g., all of the elements within an all-zero-valued sub-matrix have the value of "0") except for those sub-matrices located on a main diagonal of the right hand side matrix and another diagonal that is adjacently located to the left of the main diagonal, which are respective CSI sub-matrices (e.g., such a right hand side matrix is described below with reference to FIG. 5B).

FIG. 3A is a diagram 301 illustrating a communication device 110 operative within one or more communication systems. The device 110 includes a communication interface 320 and a processor 330. The communication interface 320 includes functionality of a transmitter 322 and a receiver 324 to support communications with one or more other devices (e.g., device 120) within a communication system. The device 110 may also include memory 340 to store information including any information generated by the device 110 to perform such operations as encoding and/or decoding of LDPC coded signals. In a reception mode of operation, The communication interface 320 may be configured to perform appropriate demodulation of received signal (e.g., a continuous-time signal) to generate another signal (e.g., a digital signal, such as a baseband signal), and the processor 330 may be configured to generate one or more estimates of one or more bits encoded within the received signal using an LDPC matrix as described herein. Also, in a transmission mode of operation, the processor 330 may be configured to process one or more bits (such as information bits) to generate an LDPC coded signal, and the communication interface 320 may be configured to perform appropriate modulation of the such an LDPC coded signal to generate and transmit another signal (e.g., a continuous-time signal) to another communication device.

The memory 340 may also store signals and/or information received from other devices via one or more communication channels. Memory 340 may also include and store various operational instructions for use by the processor 330 in regards to encoding and/or decoding of LDPC coded signals as described herein (e.g., including signals that are LDPC coded signals). The communication interface 320 is configured to support communications to and/or and from one or more other devices.

FIG. 3B illustrates an example 302 of an LDPC (Low Density Parity Check) code bipartite graph. An LDPC bipartite graph is sometimes be referred to as a "Tanner" graph. An LDPC bipartite graph is a pictorial representation of an LDPC matrix of a corresponding LDPC code, and it shows the relationship of non-null elements of the LDPC matrix in terms of performs bit or variable edge message updating (based on columns of the LDPC matrix) and check message updating (based on rows of the LDPC matrix). An LDPC code is characterized by a binary parity check matrix (i.e., LDPC matrix) that is sparse, such that nearly all of the elements of the matrix have values of zero ("0"). For example, $H=(h_{i,j})_{M \times N}$ is a parity check matrix of an LDPC code with block length N. The LDPC bipartite graph, or "Tanner" graph, is a pictorial illustration of an LDPC matrix.

LDPC codes are linear block codes and hence the set of all codewords x∈C spans the null space of a parity check matrix, H, as follows:

$$Hx^T=0, \forall x \in C \qquad (1)$$

For an LDPC code, the matrix, H, is a sparse binary matrix of dimension m×n. Each row of H corresponds to a parity check and a set element $h_{ij}$ indicates that data symbol j used for the parity check i. Each column of H corresponds to a codeword symbol.

For each codeword x, there are n symbols of which m are parity symbols. Hence the code rate of the LDPC code, r, is provided as follows:

$$r=(n-m)/n \qquad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v, d_c)$ regular LDPC code, otherwise the LDPC code is called an irregular LDPC code.

A regular LDPC code can be represented as a bipartite graph 302 by its parity check matrix with left side nodes representing variable of the code bits (or alternatively as the "variable nodes" (or "bit nodes") 361 in a bit-based decoding of LDPC coded signals), and the right side nodes representing check equations (or alternatively as the "check nodes" 362). The bipartite graph 302 (or Tanner graph 302) of the LDPC code defined by H may be defined by N variable nodes (e.g., N bit nodes) and M check nodes. Every variable node of the N variable nodes 361 has exactly $d_v(i)$ edges. An example edge shown using reference numeral 367 connects the bit node, $v_i$ 365, to one or more of the check nodes (within the M check nodes). The edge 367 is specifically shown as connecting from the bit node, $v_i$ 365, to the check node, $c_j$ 366. This number of $d_v$ edges (shown as 363) may be referred to as the degree of a variable node i. Analogously, a check node of the M check nodes 362 has $d_c(j)$ edges (shown as $d_c$ 364) connecting this node to one or more of the variable nodes (or bit nodes) 361. This number of edges, $d_c$ 364, may be referred to as the degree of the check node j.

An edge 367 between a variable node $v_i$ (or bit node $b_i$) 365 and check node $c_j$ 366 can be defined by e=(i, j). Alternatively, given an edge e=(i, j), the nodes of the edge may alternatively be denoted as by e=(v(e),c(e)) (or e=(b(e),c(e))). The edges in the graph correspond to the set elements of H where a set element $h_{ji}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$); these edges are referred to as bit edges, and the messages corresponding to these bit edges are referred to as bit edge messages.

Given a check node $c_j$, one may define the set of edges emitting from the node $c_j$ by $E_c(j)=\{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any such codes (e.g., LDPC codes) that can be represented by a bipartite graph may be characterized as a graph code. It is also noted that an irregular LDPC code may also be described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not be equal to $|E_v(i_2)|$. This relationship may also hold true for more than one (e.g., two) check nodes.

Note that terminology such as that of "bit node" and "bit edge message", or equivalents thereof, may be used on the in the art of LDPC decoding. With respect to LDPC decoding, note that "bit node" and "bit edge message" are alternatively referred to as "variable node" and "variable edge message", respectively. Note that LDPC decoding operates to make one or more estimates of the bit values (or variable values) encoded within an LDPC coded signal.

FIG. 3C illustrates an example 303 of decoding of an LDPC coded signal. Within a communication device (e.g., communication device 110), a signal received from a communication channel undergoes appropriate demodulation (e.g., processing within an analog front end including digital sampling, filtering, gain adjustment, etc.) to generate a received bit sequence. Then, a metric generator 371 calculates log-likelihood ratios (LLRs) for each bit location within the received bit sequence. These LLRs correspond initially to the bit nodes 361 of the LDPC code and its corresponding LDPC bipartite graph 302 that represents the LDPC matrix used to decode the signal.

In one implementation of LDPC decoding, during initialization, the LLRs are employed for the bit edge messages (e.g., extrinsic information) of the edges extending from the respective bit/variable nodes. Thereafter, one or more decoding cycles or iterations may be performed based on check node processing and bit node processing (iterative decoding 372). Check node processing or check node updating is performed using the original bit edge messages (e.g., the calculated LLRs) such as by a check node processor 374. A bit/variable node processor 373 then uses these updated check edge messages to perform bit node processing or bit node updating to update the variable node soft information for use in the next decoding iteration. The most recently updated variable bit/node soft information is then used to calculate the variable node edge messages (extrinsic information) for this next decoding iteration. The check node processor 374 is configured to perform check message updating (based on rows of the LDPC matrix) to generate updated check edge messages, and the bit/variable node processor 373 is configured to perform bit or variable edge message updating (based on columns of the LDPC matrix) as also described with reference to FIG. 3B.

When more than one decoding iteration is performed, these variable node edge messages are then used in by the check node processor 374 for subsequent check node processing or check node updating to calculate updated check edge messages. Then, the bit/variable node processor 373 uses the most recently updated check edge messages to perform bit node processing or bit node updating to update the variable node soft information once again.

After a final decoding iteration, which may be determined based on some parameter (e.g., a predetermined number of decoding iterations or when all syndromes of the LDPC code equal zero, as determined by a syndrome calculator 376), the last calculated variable node soft information may undergo hard limiting (e.g., in a slicer or hard limiter 375) to generate one or more estimates of one or more bits encoded within the LDPC coded signal.

Generally speaking, this approach for decoding of LDPC coded signals may be referred to as a message passing approach (or iterative message passing approach). Note that LDPC decoding may be performed in any of a variety of architectures including parallel decoding architectures, layer decoding architectures etc. The device 110 may be implemented to perform encoding and/or decoding of LDPC coded signal using any desired approach or architecture.

Note that the various functional blocks and components depicted in FIG. 3C may be implemented or performed by the processor 330 (and memory 340) of communication device 110. For example, the processor 330 can be implemented to perform such decoding operations and the memory 340 can be implemented to store and perform memory management for the various bit/variable and check edge messages, variable bit/node soft information, extrinsic information, etc. used in the decoding operations.

Figure 4:
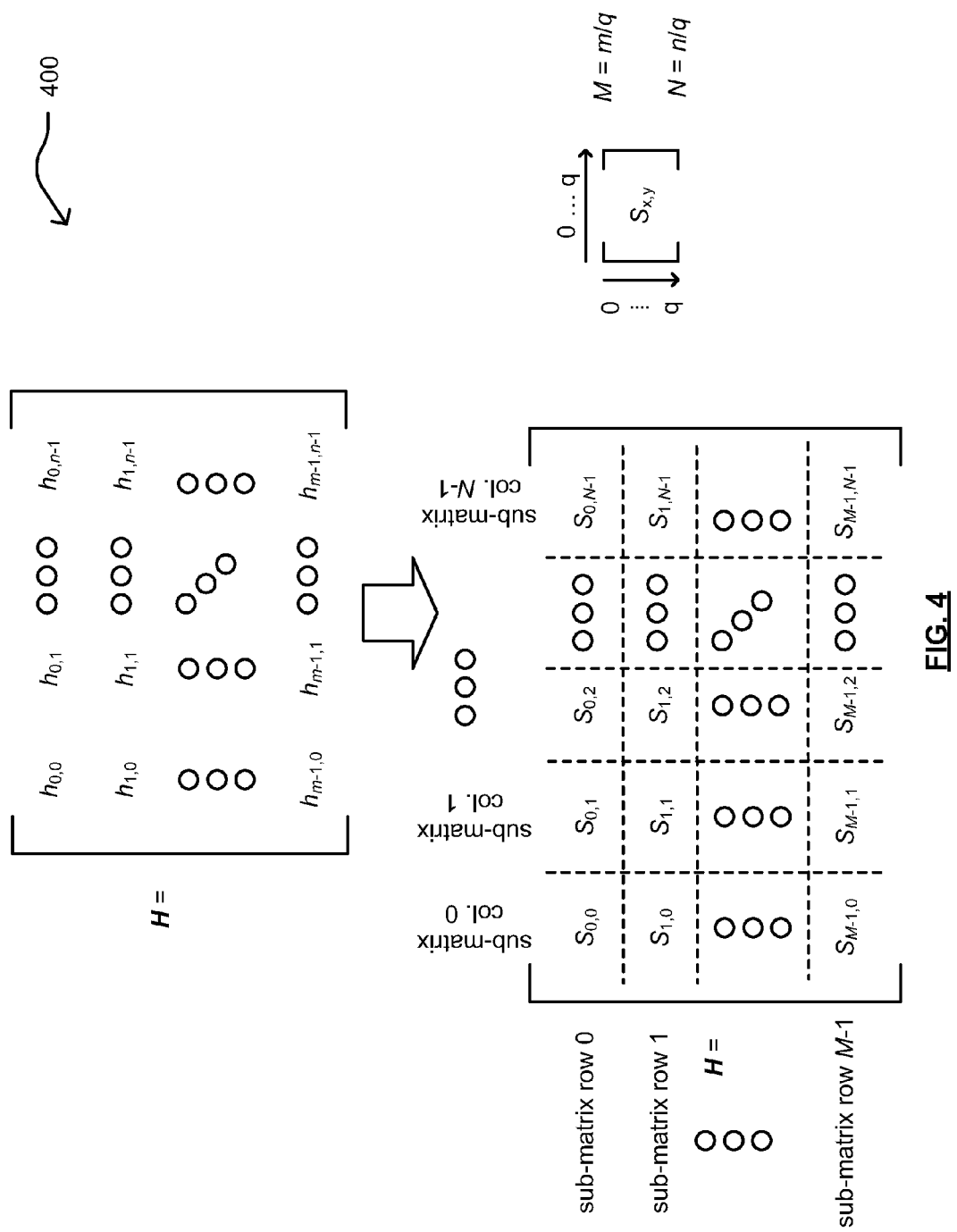
FIG. 4 illustrates an example of an LDPC matrix that is partitioned into sub-matrices.

FIG. 4 illustrates an example 400 of an LDPC matrix that is partitioned into sub-matrices. This diagram shows the relationship between an overall LDPC matrix and the individual sub-matrices therein that can be all zero-valued sub-matrices and/or CSI (Cyclic Shifted Identity) sub-matrices, and the diagram shows the sub-matrix rows and sub-matrix columns of the LDPC matrix that correspond to the sub-matrix arrangement of the LDPC matrix. Note also that a generator matrix, corresponding to an LDPC matrix, may be employed to encode at least one information bit to generate a plurality of LDPC coded bits and/or an LDPC codeword (e.g., such as using back-substitution described below). A generator matrix, G, of an LDPC code has the following relationship with LDPC matrix, H: $GH^T=0$. An LDPC code may be defined or characterized by its LDPC matrix, H, and/or its generator matrix, G.

A binary LDPC code may be fully described by its parity check matrix (i.e., its LDPC matrix). At the top of the diagram, the individual elements of an LDPC matrix, H, are shown:

$$H = \begin{bmatrix} h_{0,0} & h_{0,1} & \ldots & h_{0,n-1} \\ h_{1,0} & h_{1,1} & \ldots & h_{1,n-1} \\ \ldots & \ldots & \ldots & \ldots \\ h_{m-1,0} & h_{m-1,1} & \ldots & h_{m-1,n-1} \end{bmatrix}$$

where n is the number of bits in a codeword, m is the number of parity check equations of the LDPC code, and $h_{i,j}$ is either 0 or 1. An n-bit vector c (e.g., $c=(c_1, c_2, \ldots, c_N)$) is a codeword (i.e., of the LDPC code) if and only if $$Hc^T=0.$$

For such an LDPC code, the parity matrix H is also composed of a number of q-by-q (i.e., q×q) square sub-matrices as shown in the bottom portion of the diagram and also below:

$$H = \begin{bmatrix} S_{0,0} & S_{0,1} & \ldots & S_{0,N-1} \\ S_{1,0} & S_{1,1} & \ldots & S_{1,N-1} \\ \ldots & \ldots & \ldots & \ldots \\ S_{M-1,0} & S_{M-1,1} & \ldots & S_{M-1,N-1} \end{bmatrix}$$

where M=m/q, N=n/q, and each sub-matrix, $S_{I,J}$, thereof is a q-by-q sub-matrix that is either an all-zero-valued sub-matrix (i.e., in which all elements thereof are the value of zero "0", which is depicted by a blank or an empty sub-matrix or a sub-matrix with value of "−1" therein in the associated diagrams) or a CSI (Cyclic Shifted Identity) sub-matrix. A CSI sub-matrix S is characterized by a shift-value, $\lambda(S)$, such that the components of S are defined as follows:

$$s_{i,j} = \begin{cases} 1 & \text{if } i + \lambda(S) = j(\bmod q) \\ 0 & \text{otherwise} \end{cases}$$

for any i and j, with $0 \le i < q$ and $0 \le j < q$. For example, the q-by-q identity matrix is itself a CSI matrix with a shift-value $\lambda(S)=0$ (i.e., a CSI sub-matrix that has undergone a cyclic shift of zero "0").

As can be seen, the LDPC matrix (as depicted in the lower portion of the diagram), includes various sub-matrix rows and sub-matrix columns. These sub-matrix rows and columns are based on the sub-matrix construction of the LDPC matrix (e.g., shown as sub-matrix rows 0 through M−1 and sub-matrix columns 0 through N−1). This disclosure presents various new designs of LDPC codes.

Note also the following with respect to such LDPC code matrix constructions. A given LDPC code may be a QC (quasi-cyclic)-LDPC code. The definition of such an (n, k) QC-LDPC code is provided as follows:

1. (n−k)-by-n parity check matrix H
2. H is expanded from a binary base matrix $H_b$ of size v-by-u
3. The base matrix $H_b$ is expanded by replacing each sub-matrix in the base matrix with a size z permutation matrix, and each 0 with a size z zero matrix. The permutations used are circular right shifts as described above, and the set of permutation sub-matrices contains the size z identity matrix and circular right shifted versions of the identity matrix (i.e., CSI sub-matrices).

Because each permutation matrix is specified by a single circular right shift, the binary base matrix information and permutation replacement information can be combined into a single compact model matrix $H_{bm}$. The model matrix $H_{bm}$ is the same size as the binary base matrix $H_b$, with each binary entry (i,j) of the base matrix $H_b$ replaced to create the model matrix $H_{bm}$. Each 0 in $H_b$ is replaced by a blank or "−1" negative to denote a size z all-zero matrix, and each other sub-matrix in $H_b$ is replaced by a circular shift size $p(i,j) \geq 0$ (e.g., an entry of "−1" indicates an all-zero-valued sub-matrix, and any other entry such as 0, 1, 2, etc. indicates a CSI (Cyclic Shifted Identity) sub-matrix which can be an identity sub-matrix (if entry is 0), a CSI sub-matrix based on a shift-value of 1 (if entry is 1), a CSI sub-matrix based on a shift-value of 2 (if entry is 2), etc. and so on for any desired cyclic shift-value). The model matrix $H_{bm}$ can then be directly expanded to the entire LDPC matrix, H.

FIG. 5A is a diagram illustrating an example 501 of an LDPC matrix partitioned into a left hand side matrix and a right hand side matrix. The parity matrix H of the bottom of FIG. 4 may be partitioned into a left hand side matrix, $H_{LHS}$, and a right hand side matrix, $H_{RHS}$. The partitioning will be in between two sub-matrix columns. This diagram shows the partitioning being between sub-matrix column x−1 and sub-matrix column x. Both the left hand side matrix, $H_{LHS}$, and the right hand side matrix, $H_{RHS}$, include the same number of sub-matrix rows. In one implementation, the right hand side matrix, $H_{RHS}$, is a square matrix that includes a same number of sub-matrix rows and sub-matrix columns (e.g., the right hand side matrix, $H_{RHS}$, may generally be of any size such as z-by-z, where z is any desired number such as 2, 3, 4, 5, 6, 7, etc.).

FIG. 5B is a diagram illustrating some examples 502 of right hand side matrices of LDPC matrices. A right hand side matrix, $H_{RHS}$, having this form is lower triangular and includes all-zero-valued sub-matrices except for CSI (Cyclic Shifted Identity) sub-matrices located on a main diagonal of the right hand side matrix and another diagonal that is adjacently located to the left of the main diagonal. Note that all of the sub-matrices are all-zero-valued sub-matrices (e.g., all elements of such sub-matrices have value of "0") expect the two adjacent diagonals (e.g., the main diagonal and another diagonal that is adjacently located to the left of the main diagonal). Also, note that these sub-matrices on these two adjacent diagonals may be based on different CSI values. A CSI value of zero indicates an identity sub-matrix. A CSI value of 1 indicates an identity sub-matrix that has undergone a cyclic shift by 1. Any desired CSI value may be employed up to the sub-matrix size, z, if considering sub-matrices of size z-by-z. Generally speaking, a CSI value of x indicates an identity sub-matrix that has undergone a cyclic shift by x.

Various examples have been provided herein showing LDPC decoding that may be performed by processor 330. Processor 330 can also be configured to perform encoding of bit(s) to generate LDPC coded bit(s) and/or LDPC codeword(s). Such encoding maybe performed using back-substitution. An LDPC matrix may be partitioned into a left hand side matrix, $H_{LHS}$, and a right hand side matrix, $H_{RHS}$, such as shown in FIG. 5A. The right hand side matrix, $H_{RHS}$, can have the form of any of the right hand side matrices of FIG. 5B, and may be of any desired size such as 3-by-3, 4-by-4, 5-by-5, or generally of any size such as z-by-z, where z is any desired number such as 2, 3, 4, 5, 6, 7, etc.

Considering a right hand side matrix, $H_{RHS}$, having the form of those in FIG. 5B, a CSI sub-matrix may be a respective identity matrix that has either not been cyclic shifted (and remains an identity matrix) or a respective identity matrix that has been cyclic shifted by some amount as described above.

For sub-matrices of size, L-by-L, input (information) bits, $c_{in}$ (k bits=L(n−m) bits), may be represented as follows:

$$c_{in} = (c_0, c_1, \ldots, c_{k-1})$$

The processor 330 then encodes the input (information) bits and computes L·m parity bits, $c_{par}$ (e.g., LDPC coded bits).

$$c_{par} = (c_k, c_{k+1}, \ldots, c_{Ln-1})$$

The processor 330 then outputs the following:

$$c_P^T = \begin{pmatrix} C_0 \\ C_1 \\ C_2 \\ C_3 \\ C_4 \end{pmatrix},$$

where $$C_i = (c_{L(n-m+i)}, c_{L(n-m+i)+1}, \ldots, c_{L(n-m+i)+L-1})^T.$$

For a right hand side matrix, $H_{RHS}$, in the form of those in FIG. 5B being of size 5-by-5 (e.g., where i varies from 0 to 4 in order of 0, 1, 2, 3, 4).

The encoding procedure may be described as follows:
Input: $c_I = (c_0, c_1, \ldots, c_{k-1})$
Step 1: compute $V_i = H_{I,i} c_I^T$, such that i=0, . . . , 4.
Step 2: back-substitution $$C_0 = V_0(L - u_{0,0})$$

$$C_1 = V_1(L - u_{1,1}) + C_0((L - u_{1,1} + u_{1,0}) \bmod L)$$

$$C_2 = V_2(L - u_{2,2}) + C_1((L - u_{2,2} + u_{2,1}) \bmod L)$$

$$C_3 = V_3(L - u_{3,3}) + C_2((L - u_{3,3} + u_{3,2}) \bmod L)$$

$$C_4 = V_4(L - u_{4,4}) + C_3((L - u_{4,4} + u_{4,3}) \bmod L)$$

Output:

$$c_P^T = \begin{pmatrix} C_0 \\ C_1 \\ C_2 \\ C_3 \\ C_4 \end{pmatrix}$$

FIG. 6 is a diagram illustrating an example 600 of a long size LDPC code. This long size LDPC code has the general format as having a right hand side matrix, $H_{RHS}$, in the form of those in FIG. 5B. In some embodiments, this long size LDPC code can be used for both upstream (US) and downstream (DS) communications involved LDPC coded signals.

The LDPC matrix, H, is partitioned into a left hand side matrix, $H_{LHS}$ (which is shown pictorially as two matrices, $H_{LHS,1}$ and $H_{LHS,2}$, in the diagram because of the large size involved), and a right hand side matrix, $H_{RHS}$.

This long size LDPC code is characterized as follows:
Rate=8/9 (16200, 14400) code, m=5 sub-matrix rows×n=45 sub-matrix columns, L=360 (e.g., sub-matrices of size 360×360)
Number of equations: 1800
Number of edges: 60840
Density: 0.00209

Number of Nodes in the LDPC bipartite/Tanner graph
Bit nodes: 16200
Check nodes: 1800

FIG. 7 is a diagram illustrating an example 700 of a medium size LDPC code. This medium size LDPC code also has the general format as having a right hand side matrix, $H_{RHS}$, in the form of those in FIG. 5B. In some embodiments, this medium size LDPC code is used for upstream (US) communications only that involve LDPC coded signals. On other embodiments, this medium size LDPC code may be used for both upstream (US) and downstream (DS) communications involved LDPC coded signals.

The LDPC matrix, H, is partitioned into a left hand side matrix, $H_{LHS}$ (which is shown pictorially as two matrices, $H_{LHS,1}$ and $H_{LHS,2}$, in the diagram because of the large size involved), and a right hand side matrix, $H_{RHS}$.

This medium size LDPC code is characterized as follows:
Rate=28/33 (0.848) (5940, 5040) code, m=5 sub-matrix rows×n=33 sub-matrix columns, L=180 (e.g., sub-matrices of size 180×180)
Number of equations: 900
Number of edges: 23580
Density: 0.0044
Number of Nodes in the LDPC bipartite/Tanner graph
Bit nodes: 5940
Check nodes: 900

FIG. 8 is a diagram illustrating an example 800 of a short size LDPC code. This short size LDPC code also has the general format as having a right hand side matrix, $H_{RHS}$, in the form of those in FIG. 5B. In some embodiments, this short size LDPC code is used for upstream (US) communications only that involve LDPC coded signals. On other embodiments, this short size LDPC code may be used for both upstream (US) and downstream (DS) communications involved LDPC coded signals.

This short size LDPC code is characterized as follows:
Short size code: Rate=3/4 (1120, 840) code, m=5 sub-matrix rows×n=20 sub-matrix columns, L=56 (e.g., sub-matrices of size 56×56)
Number of equations: 280
Number of edges: 4424
Density: 0.014
Number of Nodes in the LDPC bipartite/Tanner graph
Bit nodes: 1120
Check nodes: 280

FIG. 9A is a diagram illustrating an embodiment of a method 901 for execution by one or more communication devices. Via a communication interface of a communication device, the method 901 operates by receiving and processing a low density parity check (LDPC) coded signal from another communication device via a communication channel to generate a digital signal (e.g., a baseband signal in some instances) (block 910). The LDPC code may be characterized by an LDPC matrix that is lower triangular and includes all-zero-valued sub-matrices except for CSI (Cyclic Shifted Identity) sub-matrices located on a main diagonal of the right hand side matrix and another diagonal that is adjacently located to the left of the main diagonal (block 912).

The method 901 then continues by decoding the digital signal using the LDPC matrix to make one or more estimates of one or more information bits encoded within the LDPC coded signal (block 920).

FIG. 9B is a diagram illustrating another embodiment of a method 902 for execution by one or more communication devices. The method 902 operates by receiving information bits (block 911). The method 902 then continues by encoding the information bits using a generator matrix (e.g., using back-substitution) to generate LDPC coded bits (block 921). An LDPC code may be defined or characterized by its LDPC matrix, H, and/or its generator matrix, G. The LDPC matrix of the LDPC code used in method 902 is lower triangular and includes all-zero-valued sub-matrices except for CSI (Cyclic Shifted Identity) sub-matrices located on a main diagonal of the right hand side matrix and another diagonal that is adjacently located to the left of the main diagonal (block 923).

The method 902 then operates by transmitting a signal that includes or is based on the LDPC coded bits (block 931). The method may involve generating a continuous-time signal based on the LDPC coded bits, such as by performing operations within an analog front end (AFE) of a communication device (e.g., digital to analog conversion, frequency conversion such as conversion, scaling, filtering, etc.).

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments of an invention have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The one or more embodiments are used herein to illustrate one or more aspects, one or more features, one or more concepts, and/or one or more examples of the invention. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module includes a processing module, a processor, a functional block, hardware, and/or memory that stores operational instructions for performing one or more functions as may be described herein. Note that, if the module is implemented via hardware, the hardware may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure of an invention is not limited by the particular examples disclosed herein and expressly incorporates these other combinations.

What is claimed is:

1. A communication device comprising:
   a communication interface configured to receive and process a low density parity check (LDPC) coded signal to generate a digital signal; and
   a processor configured to decode the digital signal using an LDPC matrix to make one or more estimates of one or more information bits, wherein the LDPC matrix includes a plurality of sub-matrices arranged in a left hand side matrix and a right hand side matrix, wherein the right hand side matrix is lower triangular and includes all-zero-valued sub-matrices except for CSI (Cyclic Shifted Identity) sub-matrices located on a main diagonal of the right hand side matrix and another diagonal that is adjacently located to a left of the main diagonal.

2. The communication device of claim 1, wherein:
   first sub-matrices of the CSI sub-matrices are located on the main diagonal of the right hand side matrix that extends from an upper left hand sub-matrix to a lower right hand sub-matrix of the right hand side matrix; and
   second sub-matrices of the CSI sub-matrices are located on the other diagonal of the right hand side matrix and include sub-matrices that are adjacently located to a left of sub-matrices on the diagonal, excluding the upper left hand sub-matrix of the right hand side matrix.

3. The communication device of claim 1 further comprising:
   the communication interface configured to receive another LDPC coded signal and to generate another digital signal; and
   the processor configured to decode the other digital signal using another LDPC matrix to make one or more estimates of one or more information bits, wherein the LDPC matrix includes a number of sub-matrix rows and a first number of sub-matrix columns, and the other LDPC matrix includes the number of sub-matrix rows and a second number of sub-matrix columns.

4. The communication device of claim 1 further comprising:

the processor configured to encode one or more other information bits using a generator matrix that is based on the LDPC matrix to generate another LDPC coded signal; and the communication interface configured to transmit a signal based on the other LDPC coded signal.

5. The communication device of claim 1, wherein a first CSI sub-matrix of the right hand side matrix is based on a first cyclic shift value, and a second CSI sub-matrix of the right hand side matrix is based on a second cyclic shift value.

6. The communication device of claim 1, wherein:
the LDPC matrix includes n sub-matrix rows and m sub-matrix columns such that m is a first integer and n is a second integer;
the right hand side matrix is an m×m matrix and corresponds to a parity portion of the LDPC matrix; and
an LDPC code based on the LDPC matrix has a code rate of (n−m)/n.

7. The communication device of claim 1 further comprising:
a cable modem; and
the communication interface configured to receive the LDPC coded signal from a cable headend transmitter or a cable modem termination system (CMTS).

8. The communication device of claim 1 further comprising:
the communication interface configured to support communications within at least one of a satellite communication system, a wireless communication system, a wired communication system, a fiber-optic communication system, and a mobile communication system.

9. The communication device of claim 8 further comprising:
a cable modem, wherein the another communication device is a cable headend transmitter or a cable modem termination system (CMTS).

10. A communication device comprising:
a communication interface configured to:
receive and process a first low density parity check (LDPC) coded signal from another communication device to generate a digital signal; and
transmit a second LDPC coded signal to the another communication device; and
a processor configured to:
decode the digital signal using an LDPC matrix to make one or more estimates of one or more first information bits, wherein the LDPC matrix includes a plurality of sub-matrices arranged in a left hand side matrix and a right hand side matrix, wherein the right hand side matrix is lower triangular and includes all-zero-valued sub-matrices except for CSI (Cyclic Shifted Identity) sub-matrices located on a main diagonal of the right hand side matrix and another diagonal that is adjacently located to a left of the main diagonal, a first CSI sub-matrix of the right hand side matrix is based on a first cyclic shift value, and a second CSI sub-matrix of the right hand side matrix is based on a second cyclic shift value; and
encode one or more second information bits using a generator matrix that is based on the LDPC matrix to generate the second LDPC coded signal.

11. The communication device of claim 10, wherein:
first sub-matrices of the CSI sub-matrices are located on the main diagonal of the right hand side matrix that extends from an upper left hand sub-matrix to a lower right hand sub-matrix of the right hand side matrix; and second sub-matrices of the CSI sub-matrices are located on the other diagonal of the right hand side matrix and include sub-matrices that are adjacently located to a left of sub-matrices on the diagonal, excluding the upper left hand sub-matrix of the right hand side matrix.

12. The communication device of claim 10, wherein:
the LDPC matrix includes n sub-matrix rows and m sub-matrix columns such that m is a first integer and n is a second integer;
the right hand side matrix is an m×m matrix and corresponds to a parity portion of the LDPC matrix; and
an LDPC code based on the LDPC matrix has a code rate of (n−m)/n.

13. The communication device of claim 10 further comprising:
the communication interface configured to support communications within at least one of a satellite communication system, a wireless communication system, a wired communication system, a fiber-optic communication system, and a mobile communication system.

14. A method for execution by a communication device, the method comprising:
via a communication interface of the communication device, receiving a low density parity check (LDPC) coded signal;
processing the LDPC coded signal to generate a digital signal; and
decoding the digital signal using an LDPC matrix to make one or more estimates of one or more information bits, wherein the LDPC matrix includes a plurality of sub-matrices arranged in a left hand side matrix and a right hand side matrix, wherein the right hand side matrix is lower triangular and includes all-zero-valued sub-matrices except for CSI (Cyclic Shifted Identity) sub-matrices located on a main diagonal of the right hand side matrix and another diagonal that is adjacently located to a left of the main diagonal.

15. The method of claim 14, wherein:
first sub-matrices of the CSI sub-matrices are located on the main diagonal of the right hand side matrix that extends from an upper left hand sub-matrix to a lower right hand sub-matrix of the right hand side matrix; and
second sub-matrices of the CSI sub-matrices are located on the other diagonal of the right hand side matrix and include sub-matrices that are adjacently located to a left of sub-matrices on the diagonal, excluding the upper left hand sub-matrix of a right hand side matrix.

16. The method of claim 14 further comprising:
receiving another LDPC coded signal;
processing the other LDPC coded signal to generate another digital signal; and
decoding the other digital signal using another LDPC matrix to make one or more estimates of one or more information bits, wherein the LDPC matrix includes a number of sub-matrix rows and a first number of sub-matrix columns, and the other LDPC matrix includes the number of sub-matrix rows and a second number of sub-matrix columns.

17. The method of claim 14 further comprising:
encoding one or more other information bits using a generator matrix that is based on the LDPC matrix to generate another LDPC coded signal; and
via the communication interface of the communication device, transmitting a signal based on the other LDPC coded signal.

18. The method of claim 14, wherein:
the LDPC matrix includes n sub-matrix rows and m sub-matrix columns such that m is a first integer and n is a second integer;
the right hand side matrix is an m×m matrix and corresponds to a parity portion of the LDPC matrix; and
an LDPC code based on the LDPC matrix has a code rate of (n−m)/n.

19. The method of claim 14, wherein the communication device is a cable modem, and further comprising:
receiving the LDPC coded signal from a cable headend transmitter or a cable modem termination system (CMTS).

20. The method of claim 14 further comprising:
operating the communication interface of the communication device to support communications within at least one of a satellite communication system, a wireless communication system, a wired communication system, a fiber-optic communication system, and a mobile communication system.

\* \* \* \* \*